United States Patent
Akaguma et al.

(10) Patent No.: US 10,573,619 B2
(45) Date of Patent: Feb. 25, 2020

(54) PRINTED WIRING BOARD

(71) Applicants: FUJITSU TEN LIMITED, Kobe-shi, Hyogo (JP); FUJITSU LIMITED, Kawasaki-shi, Kanagawa (JP)

(72) Inventors: Takashi Akaguma, Kobe (JP); Takafumi Yasuhara, Kobe (JP); Naohito Motooka, Nagano (JP); Satoru Hasegawa, Nagano (JP); Satoshi Yamagishi, Nagano (JP); Shinya Muroga, Nagano (JP); Kazumasa Yasuta, Nagano (JP)

(73) Assignees: FUJITSU TEN LIMITED, Kobe-shi (JP); FUJITSU LIMITED, Kawasaki-shi (JP)

( * ) Notice: Subject to any disclaimer, the term of this patent is extended or adjusted under 35 U.S.C. 154(b) by 0 days.

(21) Appl. No.: 15/477,589

(22) Filed: Apr. 3, 2017

(65) Prior Publication Data
US 2017/0301642 A1 Oct. 19, 2017

(30) Foreign Application Priority Data
Apr. 19, 2016 (JP) .................... 2016-083902

(51) Int. Cl.
*H01L 21/02* (2006.01)
*H01L 23/28* (2006.01)
*H01L 23/31* (2006.01)
*H01L 23/00* (2006.01)
*H01L 29/78* (2006.01)
(Continued)

(52) U.S. Cl.
CPC .............. *H01L 24/48* (2013.01); *H01L 24/40* (2013.01); *H01L 24/49* (2013.01); *H01L 29/7811* (2013.01); *H01M 10/052* (2013.01); *H01M 10/46* (2013.01)

(58) Field of Classification Search
None
See application file for complete search history.

(56) References Cited

U.S. PATENT DOCUMENTS

| | | | |
|---|---|---|---|
| 2002/0089053 A1* | 7/2002 | Liu | H01L 21/4832 257/690 |
| 2012/0139109 A1* | 6/2012 | Choi | H01L 21/56 257/738 |
| 2012/0326338 A1* | 12/2012 | Eguchi | H05K 1/148 257/786 |

FOREIGN PATENT DOCUMENTS

| | | |
|---|---|---|
| JP | H05-304223 A | 11/1993 |
| JP | H06-163749 A | 6/1994 |

(Continued)

OTHER PUBLICATIONS

Oct. 23, 2019 Office Action issued in Japanese Patent Application No. 2016-083902.

*Primary Examiner* — Joseph C. Nicely
*Assistant Examiner* — Lamont B Koo
(74) *Attorney, Agent, or Firm* — Oliff PLC

(57) ABSTRACT

A printed wiring board according to an embodiment includes a metal plate and a wiring member. The meal plate includes a current path part, which is a main current path of an electronic part mounted on or above a front surface of the metal plate, and a heat radiation part, which radiates heat generated from the electronic part. The wiring member is arranged on or above a back surface of the metal plate. The current path part and the heat radiation part are in the same layer to be integrally formed with the wiring member.

11 Claims, 5 Drawing Sheets

(51) Int. Cl.
*H01M 10/052* (2010.01)
*H01M 10/46* (2006.01)

(56) References Cited

FOREIGN PATENT DOCUMENTS

| | | |
|---|---|---|
| JP | 2006-352175 A | 12/2006 |
| JP | 2008-021819 A | 1/2008 |

* cited by examiner

PRINTED WIRING BOARD

CROSS-REFERENCE TO RELATED APPLICATION

This application is based upon and claims the benefit of priority of the prior Japanese Patent Application No. 2016-083902, filed on Apr. 19, 2016 the entire contents of which are incorporated herein by reference.

FIELD

The embodiments discussed herein are directed to a printed wiring board.

BACKGROUND

Conventionally, when an electronic part that generates large heat caused by a supplied large current is mounted on a printed wiring board, a heat radiation member is embedded in the printed wiring board at a position where the electronic part is mounted so as to radiate the heat generated from the electronic part by using this heat radiation member (for example, Japanese Laid-open Patent Publication No. 05-304223).

However, when the heat is radiated to the outside of the printed wiring board by using the aforementioned embedded heat radiation member, a heat radiating sheet and the like are needed to be additionally provided on or above the back surface of the printed wiring board. Moreover, in order to supply the large current to the electronic part from the outside, a bus bar that is a terminal for the large current is also needed to be additionally provided on the printed wiring board. In other words, in the conventional technology, the number of members to be additionally provided on the printed wiring board becomes large to increase the member cost and the member mounting processes. This leads to increasing the manufacturing costs of the printed wiring board and a product into which this printed wiring board is built.

SUMMARY

A printed wiring board according to an embodiment includes a metal plate and a wiring member. The meal plate includes a current path part, which is a main current path of an electronic part mounted on or above a front surface of the metal plate, and a heat radiation part, which radiates heat generated from the electronic part. The wiring member is arranged on or above a back surface of the metal plate. The current path part and the heat radiation part are in the same layer to be integrally formed with the wiring member.

DESCRIPTION OF EMBODIMENTS

Hereinafter, embodiments of a printed wiring board will be described in detail with reference to the accompanying drawings. Moreover, the disclosed technology is not limited to the embodiments described below.

First Embodiment

Figure 1:
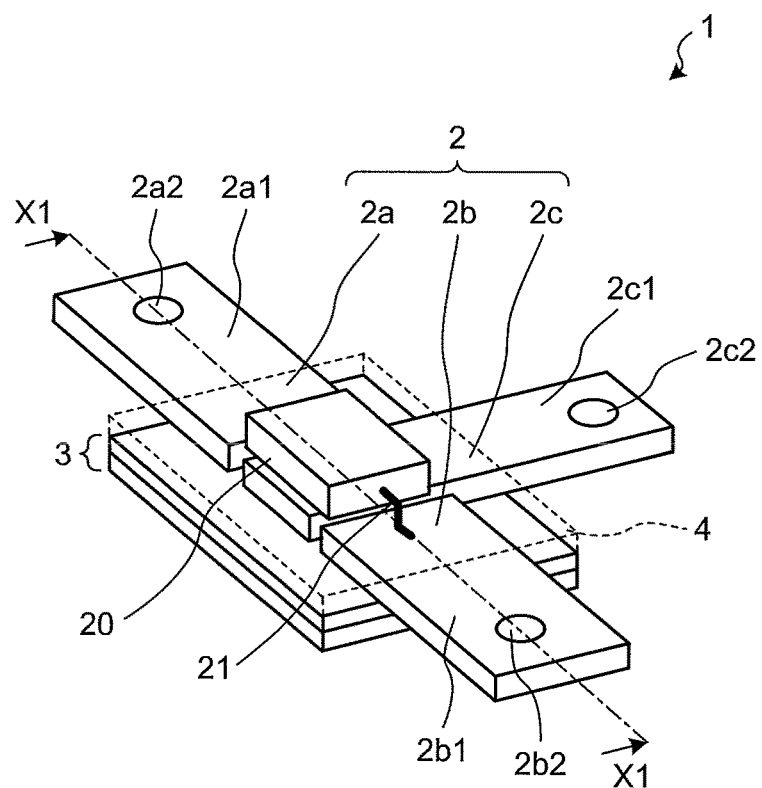
FIG. 1 is a perspective view illustrating a printed wiring board according to a first embodiment.

FIG. 1 is a perspective view illustrating a configuration of a printed wiring board 1 according to a first embodiment. The printed wiring board 1 according to the present embodiment is effective for a printed wiring board used in an electronic controller mounted on a vehicle such as an electronic controller used for controlling large electric power/high load in controlling a motor and the like. On the other hand, the use of the printed wiring board 1 according to the present embodiment is not limited to an electronic controller.

As illustrated in FIG. 1, the printed wiring board 1 according to the first embodiment includes a metal plate 2 and a wiring member 3 that is arranged on or above the back surface of the metal plate 2. The metal plate 2 includes current path parts 2a and 2b that are main current paths supplying the large current to an electronic part 20 and a heat radiation part 2c that radiates the heat generated from the electronic part 20.

Herein, in the printed wiring board 1 according to the first embodiment, the current path parts 2a and 2b and the heat radiation part 2c are integrally formed, in the same layer, with the wiring member 3 that is a printed board. Thus, addition of one metal plate 2 can realize both improvement of the heat radiating property and supply of the large current. This is because the current path parts 2a and 2b and the heat radiation part 2c are formed in the same layer, when the electronic part 20 is mounted on a surface thereof, the large current can be stably supplied to or derived from the electronic part 20, and the heat generated from the electronic part 20 can be effectively radiated. Therefore, the number of members additionally needed for the wiring member 3 that is a printed board can be reduced, and thus the manufacturing cost thereof can be reduced. In the printed wiring board 1 according to the first embodiment, the metal plate 2 and the wiring member 3 may be preliminarily formed in an integrated manner in manufacturing the printed wiring board 1, or the current path parts 2a and 2b and the heat radiation part 2c may be divided from one metal plate 2 in the manufacturing process thereof.

Hereinafter, details of the printed wiring board 1 according to the first embodiment will be explained. The metal plate 2 is approximately plate-shaped, the wiring member 3 that is a printed board is arranged on or above the back surface thereof, and the electronic part 20 can be mounted on or above the front surface thereof. The metal plate 2 is made of copper (Cu), aluminum (Al), or the like, and the thickness thereof is, for example, approximately 1 mm. The thickness of the metal plate 2 is not limited to approximately 1 mm, and may be less than 1 mm or more than 1 mm.

The metal plate 2 of the printed wiring board 1 is approximately T-shaped in planar view, and is divided into the current path parts 2a and 2b positioning on both edge sides thereof and the heat radiation part 2c positioning at the center thereof. A dividing method of the metal plate 2 includes, for example, a physical method using the dicing saw and the like, a chemical method using the etching and the like, and an optical method using the laser cutter and the like. The front surface and the side surfaces of the metal plate 2 on the wiring member 3 are covered by the covering member 4 having a high heat-radiation resin layer, a metal layer, etc. Details of the covering member 4 will be mentioned later.

The heat radiation part 2c of the printed wiring board 1 is arranged so as to include, in planar view, a position on which the electronic part 20 is mounted. In other words, the heat radiation part 2c is arranged so as to close to the electronic part 20. Therefore, the heat generated from the electronic part 20 can be effectively radiated by using the heat radiation part 2c closing thereto.

Moreover, in the printed wiring board 1, the current path parts 2a and 2b of the metal plate 2 can be electrically connected to the electronic part 20 through respective terminals 21 and the like. Thus, a main current that is large current can be supplied to the electronic part 20 from an external electric-power source (not illustrated) through the current path parts 2a and 2b. In other words, the current path parts 2a and 2b function as main current paths of the printed wiring board 1. In the printed wiring board 1, the main current that can be supplied to the electronic part 20 is, for example, 50 amperes or more.

The wiring member 3 is approximately plate-shaped, and is configured by laminating resin layers and wired layers. The wiring member 3 is, for example, a printed board such as a rigid board, a flexible board, and rigid-flexible board.

The wiring member 3 functions as a control signal path that transmits, from outside, signals that control various operations of the electronic part 20, for example. The control signals that control the electronic part 20 are transmitted through the path from the wiring member 3 to the electronic part 20 by way of the covering member 4 and the like. In the accompanying drawings of the present application, illustration of the control signal path of the printed wiring board 1 is omitted.

The main current is input to the current path part 2a from the external electric-power source, and is further input to the electronic part 20 through a metal connection part 8 (see FIG. 3) and a metal layer 6 (see FIG. 3) arranged on or above the front surface of the metal plate 2. The main current output from the electronic part 20 is output to the current path part 2b through the metal connection part 8 and the metal layer 6 arranged on or above the front surface of the metal plate 2, and is further output to outside from the current path part 2b.

In the printed wiring board 1, the current path parts 2a and 2b and the heat radiation part 2c of the metal plate 2 include respective protruding parts 2a1, 2b1, and 2c1 that protrude from the wiring member 3 in planar view. Moreover, the protruding parts 2a1, 2b1, and 2c1 are formed into shapes to be directly connectable with an external device. In FIG. 1, as an example of the shapes to be directly connectable with the external device, the through-holes 2a2, 2b2, and 2c2 are exemplified, which penetrate from the front surface to the back surface of the metal plate 2. Next, functions of the protruding parts 2a1, 2b1, and 2c1 and those of the through-holes 2a2, 2b2, and 2c2 will be explained with reference to FIG. 2.

Figure 2:
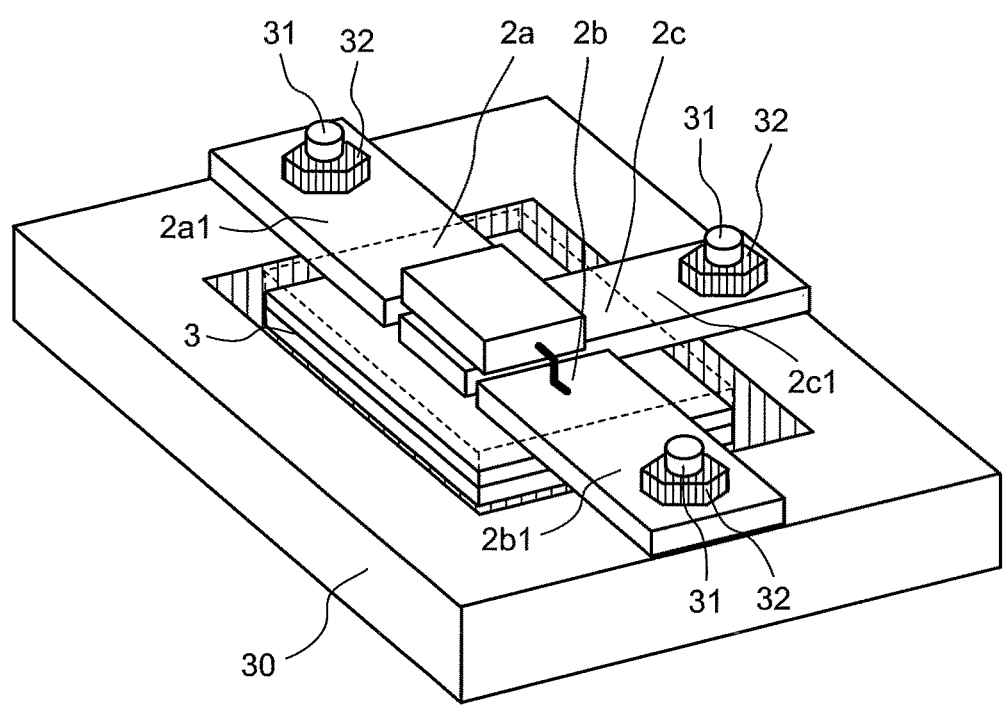
FIG. 2 is a perspective view illustrating an arrangement example of the printed wiring board according to the first embodiment.

FIG. 2 is a perspective view illustrating an arrangement example of the printed wiring board 1 according to the first embodiment. In FIG. 2, a housing 30 is illustrated, whose center part is recessed and external terminals 31 are provided at a frame part that is the outer periphery thereof. The frame part of the housing 30 has width and position so that the frame part can contact with the protruding parts 2a1, 2b1, and 2c1, and the external terminals 31 have respective diameters and positions so that the external terminals 31 can be inserted into the respective through-holes 2a2, 2b2, and 2c2 (see FIG. 1). The housing 30 is made of insulating material such as the resin and the ceramic. A cover member (not illustrated) is placed on the housing 30 to almost seal the printed wiring board 1 on which the electronic part 20 is mounted, and the printed wiring board 1 is mounted on a vehicle and the like in this state.

Herein, the printed wiring board 1 includes the protruding parts 2a1, 2b1, and 2c1 and the protruding parts 2a1, 2b1, and 2c1 include the through-holes 2a2, 2b2, and 2c2, and thus the printed wiring board 1 can be directly connected with the housing 30 by using nuts 32 without additionally providing a bus bar and the like.

The wiring member 3 of the printed wiring board 1 is rectangular-shaped, and the protruding part 2a1 (or 2b1) of the current path part 2a (or 2b) and the protruding part 2c1 of the heat radiation part 2c protrude from respective different sides of the wiring member 3. In other words, the protruding part 2a1 (or 2b1) and the protruding part 2c1 protrude in respective different directions from separated positions, and thus the external terminal 31 corresponding to the protruding part 2a1 (or 2b1) and the external terminal 31 corresponding to the protruding part 2c1 are arranged so that they separate largely.

Thus, the current path part of the housing 30 corresponding to the protruding part 2a1 (or 2b1) and the heat radiation part of the housing 30 corresponding to the protruding part 2c1 can be optimally designed without being limited by a layout of each other. Therefore, the supply characteristics of the large current and the heat radiating property of the printed wiring board 1 arranged in the housing 30 can be improved more.

Figure 3:
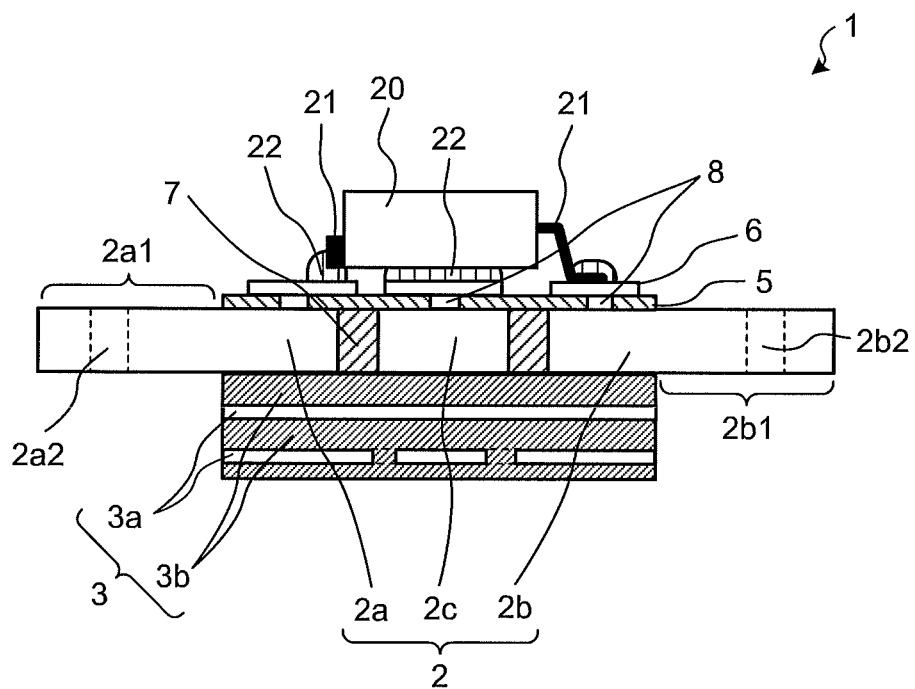
FIG. 3 is a cross-sectional view taken along a line X1-X1 illustrated in FIG. 1.

Next, the detailed constitution of the printed wiring board 1 according to the first embodiment will be explained. FIG. 3 is a cross-sectional view taken along a line X1-X1 illustrated in FIG. 1.

The current path parts 2a and 2b and the heat radiation part 2c of the metal plate 2 are integrally formed, in the same layer, with the wiring member 3. The front surface and the side surfaces of the metal plate 2 on the wiring member 3 are covered by the covering member 4 (see FIG. 1) having the high heat-radiation resin layer 5, the metal layer 6, a resin 7, etc.

In the printed wiring board 1, the high heat-radiation resin layer 5 is arranged on the front surface of the metal plate 2, the patterned metal layer 6 is arranged on the high heat-radiation resin layer 5, and the metal connection parts 8 are provided in the high heat-radiation resin layer 5, which connect the current path parts 2a and 2b and the metal layer 6 by using metal. The combination of the metal layer 6 and the metal connection parts 8 enables the current path parts 2a and 2b and the respective terminals 21 of the electronic part 20 to be electrically connected with each other. Therefore, the electronic part 20 can be mounted on the printed wiring board 1 by using a method similar to a conventional method used when an electronic part is mounted on a printed wiring board. In this case, the terminals 21 of the electronic part 20 and the metal layer 6 are bonded by using, for example, conductive bonding members 22 so as to be electrically connected.

In the printed wiring board 1, the high heat-radiation resin layer 5 may be arranged at the position on the front surface of the metal plate 2 where the electronic part 20 is mounted. In other words, the high heat-radiation resin layer 5 may be arranged at the position closing to the electronic part 20 on the front surface of the heat radiation part 2c. The arranging of the high heat-radiation resin layer 5, whose heat radiating property is higher than that of the ordinary resin, on the front surface of the heat radiation part 2c enables the heat generated from the electronic part 20 to be effectively conducted to the adjacent heat radiation part 2c. The high heat-radiation resin layer 5 is made by, for example, filling filler in epoxy-resin base to provide the high heat-radiating property, and the thickness thereof is approximately 0.05 mm, for example.

The metal layer 6 is made of, for example, Cu, Al, and the like, and the thickness thereof is 0.03 mm, for example. The metal connection part 8 is formed, for example, by filling the through-holes provided in the high heat-radiation resin layer 5 with the metal such as Cu, Al, and solder.

In the printed wiring board 1, the input current from an external electric-power source is applied to the current path part 2a through the external terminal 31 (see FIG. 2) that is inserted into the through-hole 2a2 and the protruding part 2a1. The current applied to the current path part 2a is input to the electronic part 20 through the metal connection part 8, the metal layer 6, and the terminal 21.

The current output from the electronic part 20 is applied to the current path part 2b through the terminal 21, the metal layer 6, and the metal connection part 8. The current applied to the current path part 2b is output to outside through the protruding part 2b1 and the external terminal 31 that is inserted into the through-hole 2b2.

The resin 7 fills a gap between the metal plates 2 that are separately arranged, and covers side surfaces of the metal plates 2 and the like. The resin 7 has a function that ensures insulation property between the current path parts 2a and 2b and the heat radiation part 2c of the metal plate 2. The resin 7 is made of the insulating resin such as epoxy resin, phenol resin, and polyimide resin. The current path parts 2a and 2b and the heat radiation part 2c are arranged so that they separate from each other so that the resin 7 can easily fill the gaps therebetween, and thus the insulation property between the current path parts 2a and 2b and the heat radiation part 2c can be reliably ensured.

It is preferable that the metal layer 6 and the metal connection part 8 of the printed wiring board 1 are arranged at the position on the front surface of the metal plate 2 where the electronic part 20 is mounted, in other words, at the position closing to the electronic part 20 on the front surface of the heat radiation part 2c. When the metal layer 6 and the metal connection part 8 are arranged at the position closing to the electronic part 20 on the front surface of the heat radiation part 2c, the heat generated by the electronic part 20 can be efficiently radiated by the heat radiation part 2c.

Moreover, in the printed wiring board 1, the metal layer 6, which is arranged between the heat radiation part 2c and the electronic part 20, and a bottom surface of the electronic part 20 may be connected with each other by the conductive bonding member 22. In this case, the heat generated by the electronic part 20 can be conducted to the heat radiation part 2c through the conductive bonding member 22, and thus the heat can be radiated more efficiently.

It is preferable that, in the printed wiring board 1, an interval between the heat radiation part 2c and the electronic part 20 is set to 0.1 mm or less. In a case where the interval between the heat radiation part 2c and the electronic part 20 is set to 0.1 mm or less, even when the conductive bonding member 22 and the like are not arranged therebetween, the heat generated from the electronic part 20 can be effectively conducted to the heat radiation part 2c.

Wired layers 3a and resin layers 3b are laminated to configure the wiring member 3, and the wiring member 3 is arranged on or above the back surface of the metal plate 2. In the printed wiring board 1 according to the first embodiment, the wiring member 3 is directly bonded to the back surface of the metal plate 2, however, another member may be arranged between the wiring member 3 and the metal plate 2.

First Modification

Figure 4:
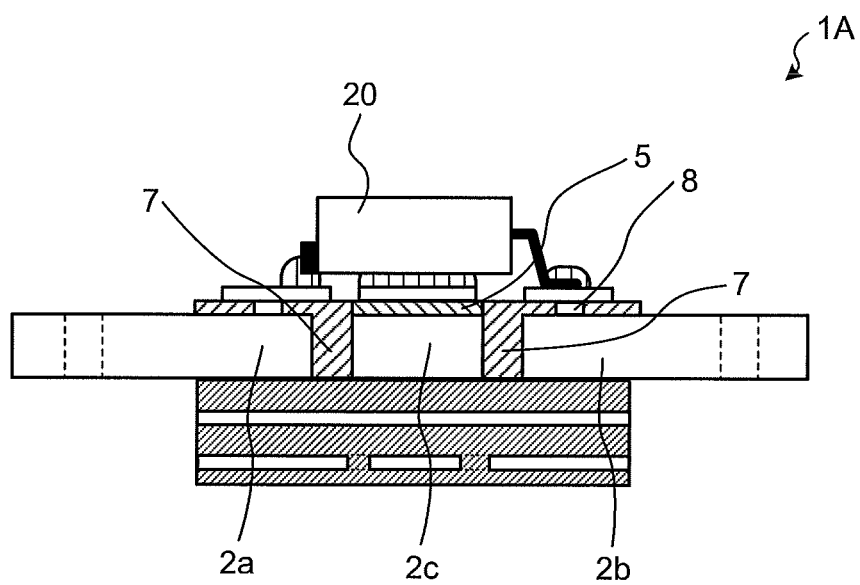
FIG. 4 is a cross-sectional view illustrating a printed wiring board according to a first modification of the first embodiment.

FIG. 4 is a cross-sectional view illustrating a printed wiring board 1A according to a first modification of the first embodiment. FIG. 4 corresponds to FIG. 3 according to the first embodiment.

Difference between the printed wiring board 1A according to the first modification of the first embodiment and the printed wiring board 1 according to the first embodiment is a configuration of the high heat-radiation resin layer 5, the resin 7, and the metal connection parts 8. The other parts are similar to the configuration of the printed wiring board 1 according to the first embodiment, and thus detailed explanation of the common configuration therebetween will be omitted by providing the same reference symbols as those of the printed wiring board 1.

The high heat-radiation resin layer 5 of the printed wiring board 1A is arranged only at the position closing to the electronic part 20 on the front surface of the heat radiation part 2c. The resin 7, not the high heat-radiation resin layer 5, is arranged on the front surfaces of the current path parts 2a and 2b. Therefore, the use amount of the high heat-radiation resin layer 5 whose cost is higher than that of the resin 7 can be minimized, and thus the manufacturing cost thereof can be reduced.

In the printed wiring board 1A, the metal connection parts 8 are provided on only the current path parts 2a and 2b, and any of the metal connection parts 8 is not provided on the heat radiation part 2c. In a case where the electronic part 20 of such a type that the back surface thereof short-circuits with a signal line is mounted, when the metal connection part 8 is provided on the heat radiation part 2c, the signal line short-circuits with the heat radiation part 2c, and thus a failure in the operation of the electronic part 20 occurs in some cases. Therefore, in a case where this electronic part 20 is used, when the metal connection part 8 is not provided on the heat radiation part 2c, the electronic part 20 can be caused to stably operate. In other words, when appropriately selecting whether or not the metal connection part 8 is provided on the heat radiation part 2c in accordance with the internal constitution of the electronic part 20, both of the stable operation and the heat radiating property of the electronic part 20 can be satisfied.

Second Modification

Figure 5:
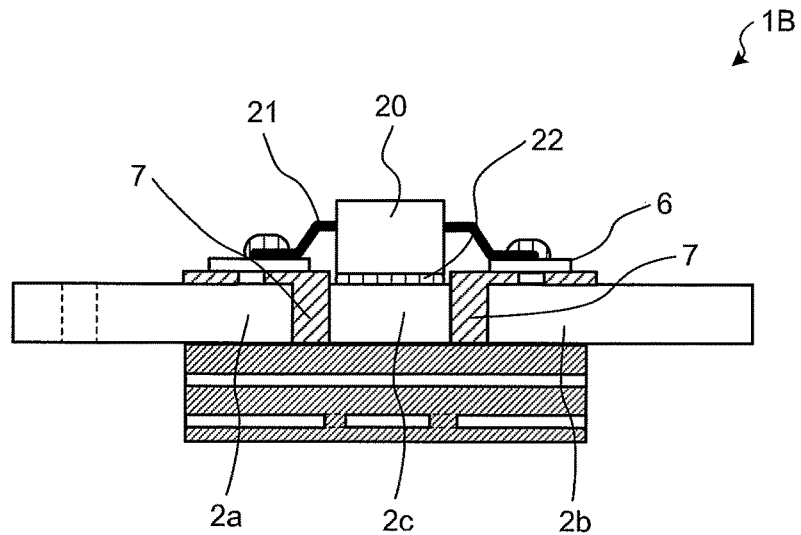
FIG. 5 is a cross-sectional view illustrating a printed wiring board according to a second modification of the first embodiment.

FIG. 5 is a cross-sectional view illustrating a printed wiring board 1B according to a second modification of the first embodiment. FIG. 5 corresponds to FIG. 3 according to the first embodiment.

Differences between the printed wiring board 1B according to the second modification of the first embodiment and the printed wiring board 1 according to the first embodiment are a configuration of the high heat-radiation resin layer 5, the metal layer 6, and the resin 7, and a configuration of the terminal 21 of the electronic part 20.

In the printed wiring board 1B, the resin 7, not the high heat-radiation resin layer 5, is arranged on the front surfaces of the current path parts 2a and 2b. The high heat-radiation resin layer 5 and the metal layer 6 are not arranged on the front surface of the heat radiation part 2c, and the electronic part 20 is directly bonded to the heat radiation part 2c by using the conductive bonding member 22. Therefore, the heat generated from the electronic part 20 can be directly conducted to the heat radiation part 2c, and thus the heat can be radiated more efficiently. The high heat-radiation resin layer 5 whose cost is high is not needed to be used, and thus the manufacturing cost thereof can be reduced.

The electronic part 20 according to the second modification has the internal constitution of such a type that the back surface thereof does not short-circuit with a signal line. Therefore, even when the electronic part 20 is directly bonded to the heat radiation part 2c, the electronic part 20 can be caused to stably operate. Moreover, the terminals 21 of the electronic part 20 extend toward the respective current path parts 2a and 2b from the side surfaces thereof, not the bottom surface thereof, and thus the terminals 21 and the heat radiation part 2c can be mounted without short-circuiting therebetween.

In FIG. 5, the terminals 21 are connected with the respective current path parts 2a and 2b through the metal layer 6 and the metal connection parts 8. However, the resin 7, the metal layer 6, and the metal connection part 8 are not provided to a part that does not need a surface wiring, and the terminals 21 may be directly bonded with the respective current path parts 2a and 2b by using the solder and the like. When the terminals 21 are directly bonded to the respective current path parts 2a and 2b, the current paths can be shortened, and a large current can be stably flowed because the current does not flow through the metal layer 6 and the metal connection parts 8.

As still another modification of the first embodiment, the printed wiring board 1 may have a configuration in which one of the current path parts (for example, current path part 2b) and the heat radiation part 2c are integrated instead of being divided. In this case, the heat can be radiated from not only the heat radiation part 2c but also the current path part 2b, and thus the heat can be radiated more efficiently. In a case of this modification, the electronic part 20 may have the internal constitution of such a type that the back surface thereof does not short-circuit with a signal line. Or, a constitution may be employed, in which the electronic part 20 is electrically insulated from the heat radiation part 2c. Moreover, the electronic part 20 having the internal constitution in which the back surface of the electronic part 20 and the terminal 21 are conducted with each other may be used.

Second Embodiment

Figure 6:
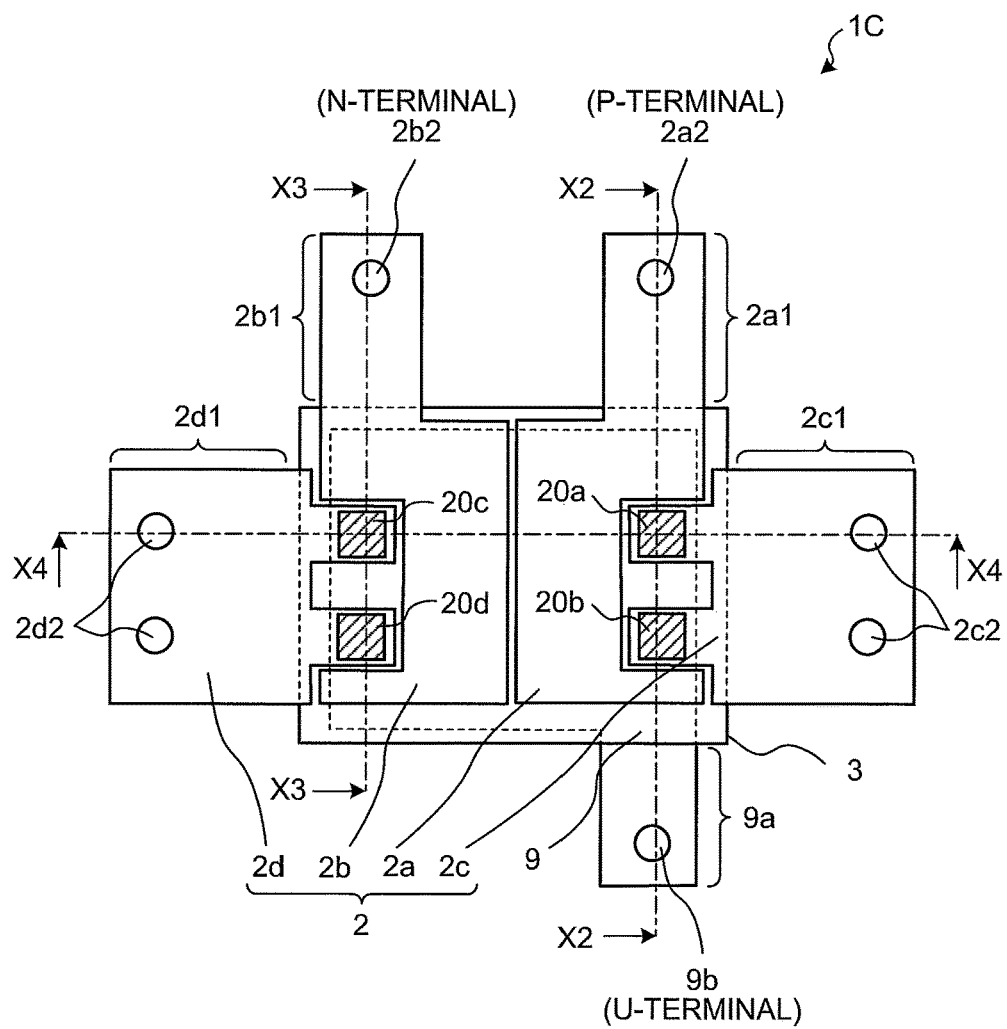
FIG. 6 is a top view illustrating a printed wiring board according to a second embodiment.

FIG. 6 is a top view illustrating a printed wiring board 1C according to a second embodiment.

Difference between the printed wiring board 1C according to the second embodiment and the printed wiring board 1 according to the first embodiment is a circuit configuration. A conductive plate 9 is added on or above the back surface of the wiring member 3 so as to realize the different circuit configuration.

As illustrated in FIG. 6, the printed wiring board 1C according to the second embodiment includes the metal plate 2, the wiring member 3, and the conductive plate 9. The metal plate 2 includes the current path parts 2a and 2b that are main current paths of a plurality of electronic parts 20a to 20d; and the heat radiation parts 2c and 2d that radiate the heat generated from the electronic parts 20a to 20d.

Moreover, the current path parts 2a and 2b and the heat radiation parts 2c and 2d are integrally formed, in the same layer, with the wiring member 3. Therefore, similarly to the printed wiring board 1 according to the first embodiment, addition of one metal plate 2 can realize both improvement of the heat radiating property and supply of the large current.

The metal plate 2 of the printed wiring board 1C is approximately n-shaped in planar view, and the current path parts 2a and 2b on the center side are arranged approximately line-symmetrically and the heat radiation parts 2c and 2d on the both end sides are also arranged approximately line-symmetrically. However, the metal plate 2 is not needed to have the approximately line-symmetrical configuration.

The current path parts 2a and 2b and the heat radiation parts 2c and 2d includes protruding parts 2a1, 2b1, 2c1, and 2d1 that respectively protrude from the wiring member 3 in planar view. Moreover, the protruding parts 2a1, 2b1, 2c1, and 2d1 include respective through-holes 2a2, 2b2, 2c2, and 2d2 having directly connectable shapes with an external device. Therefore, similarly to the printed wiring board 1 according to the first embodiment, the printed wiring board 1C can be directly connected with the housing 30 (see FIG. 2).

The through-hole 2a2 of the printed wiring board 10 functions as a P-terminal to which a current from an external electric-power source (not illustrated) is input. The input current from the external electric-power source is input to the electronic parts 20a and 20b through the current path part 2a. When the electronic parts 20a and 20b are in the conductive state and the electronic parts 20c and 20d are in the non-conductive state, the current output from the electronic parts 20a and 20b is output to the external device (not illustrated) from a through-hole 9b, which functions as a U-terminal, through the conductive plate 9 arranged on or above the back surface of the wiring member 3.

Herein, the conductive plate 9 includes a conductive protruding part 9a protruding from the wiring member 3, and the conductive protruding part 9a includes the through-hole 9b having directly connectable shape with the external device. Therefore, the conductive plate 9 can be directly connected with the housing 30 (see FIG. 2).

When the electronic parts 20a and 20b are in the non-conductive state and the electronic parts 20c and 20d are in the conductive state, the current input to the U-terminal from the external device is output to a grounded part (not illustrated) from the through-hole 2b2, which functions as an N-terminal, through the conductive plate 9, the electronic parts 20c and 20d, and the current path part 2b.

The printed wiring board 1C includes the heat radiation part 2c that radiates the heat generated from the electronic parts 20a and 20b; and the heat radiation part 2d that radiates the heat generated from the electronic parts 20c and 20d. Moreover, the heat radiation parts 2c is arranged so that the heat radiation parts 2c includes, in planar view, the positions where the electronic parts 20a and 20b are mounted and the heat radiation parts 2d is arranged so that the heat radiation parts 2d includes, in planar view, the positions where the electronic parts 20c and 20d are mounted. Therefore, similarly to the printed wiring board 1, the heat generated from the electronic parts 20a to 20d can be effectively radiated by using the adjacent heat radiation parts 2c and 2d.

As illustrated in FIG. 6, in a case where a plurality of electronic parts is mounted on a printed wiring board, when a plurality of heat radiation parts is arranged on the printed wiring board, the heat radiating efficiency of the heat generated from the electronic parts can be improved compared with the case where one heat radiation part is arranged.

In the printed wiring board 1C, the wiring member 3 is rectangular-shaped, and the protruding parts 2a1 and 2b1 of the respective current path parts 2a and 2b protrude from a side of the wiring member 3, which is different from sides from which the protruding parts 2c1 and 2d1 of the respective heat radiation parts 2c and 2d protrude. Thus, similarly to the printed wiring board 1 according to the first embodiment, the current path parts of the housing 30 (see FIG. 2) and the heat radiation parts of the housing 30 can be optimally designed without being limited by a layout of one another. Therefore, the supply characteristics of the large current and the heat radiating property of the printed wiring board 1C arranged in the housing 30 can be more improved.

Moreover, in the printed wiring board 1C, the heat radiation parts 2c and 2d also protrude from the respective different sides of the wiring member 3. Thus, heat radiation members, which are provided to the housing 30 and the like so as to be directly connected with the heat radiation parts 2c and 2d, can be arranged separately. Therefore, the heat radiating efficiency of the heat generated from each of the electronic parts can be more improved.

In the printed wiring board 1C, each of the heat radiation parts 2c and 2d has a plurality of convex parts protruding, in planar view, from one side thereof, and the electronic parts 20a to 20d are mounted on the respective convex parts. The adjacent electronic parts are mounted on the respective convex parts, and thus the heat-interference effect caused by the heat generated from the adjacent electronic part can be reduced.

Figure 7:
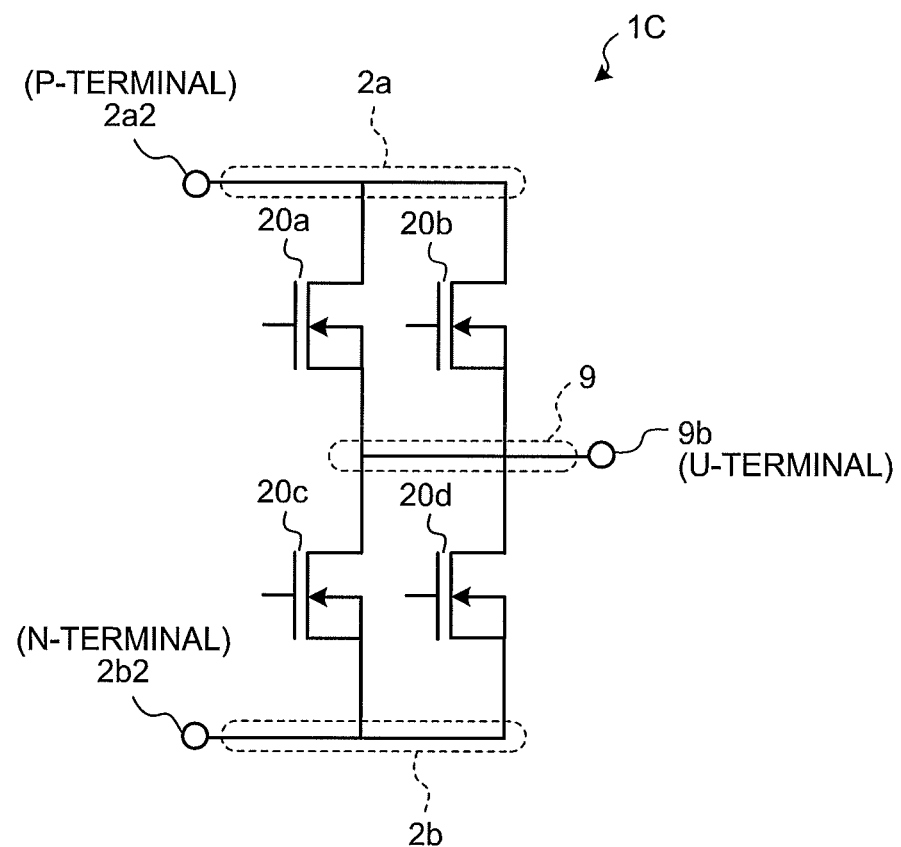
FIG. 7 is a diagram illustrating a circuit configuration of the printed wiring board according to the second embodiment.

Next, the circuit configuration of the printed wiring board 1C according to the second embodiment is illustrated in FIG. 7. In FIG. 7, the case is exemplified, in which the electronic parts 20a to 20d mounted on the printed wiring board 1C are power Metal-Oxide-Semiconductor Field-Effect Transistors (power MOSFETs).

In the printed wiring board 1C according to the second embodiment, the through-hole 2a2 that functions as the P-terminal is arranged in the current path part 2a, the through-hole 9b that functions as the U-terminal is arranged in the conductive plate 9, and the through-hole 2b2 that functions as the N-terminal is arranged in the current path part 2b. The electronic parts 20a and 20b are connected in a parallel manner between the current path part 2a and the conductive plate 9. The electronic parts 20c and 20d are connected in a parallel manner between the conductive plate 9 and the current path part 2b.

When the electronic parts 20a and 20b are in the conductive state and the electronic parts 20c and 20d are in the non-conductive state, the current input from the P-terminal is output from the U-terminal through the current path part 2a, the electronic part 20a or the electronic part 20b, and the conductive plate 9.

When the electronic parts 20a and 20b are in the non-conductive state and the electronic parts 20c and 20d are in the conductive state, the current input into the U-terminal is output from the N-terminal through the conductive plate 9, the electronic part 20c or the electronic part 20d, and the current path part 2b.

Herein, in the printed wiring board 1C, the conductive plate 9 is arranged on or above the back surface of the wiring member 3, and thus such a complicated circuit configuration as illustrated in FIG. 7 can be realized.

In the printed wiring board 1C, the two electronic parts are connected in a parallel manner between the terminals. However, the three electronic parts or more may be connected in a parallel manner therebetween, or only one electronic part may be connected therebetween. Moreover, the case is exemplified, in which the power MOSFETs are used as the electronic parts 20a to 20d, however, bipolar transistors, Insulated Gate Bipolar Transistors (IGBTs), etc. may be used.

Figure 8:
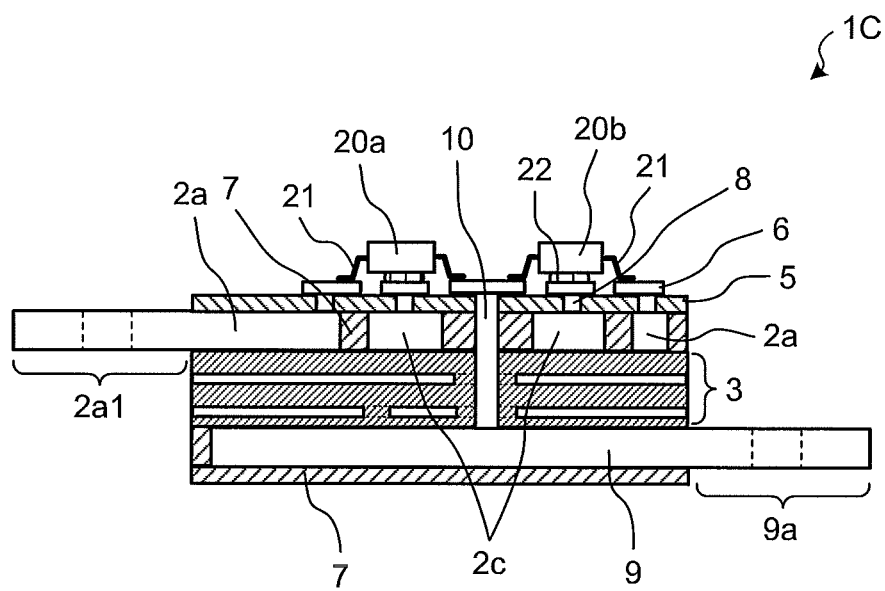
FIG. 8 is a cross-sectional view taken along a line X2-X2 illustrated in FIG. 6.

Next, a detailed constitution of the printed wiring board 1C according to the second embodiment will be explained with reference to FIGS. 8 to 10. FIG. 8 is a cross-sectional view taken along a line X2-X2 illustrated in FIG. 6.

In the printed wiring board 1C, the wiring member 3 is arranged on or above the back surface of the metal plate 2 (see FIG. 6) including the current path part 2a, the heat radiation part 2c, etc. The electronic parts 20a and 20b and the like can be mounted on or above the front surface of the metal plate 2. Moreover, the conductive plate 9 is arranged on a side of a surface opposed to a surface facing the metal plate 2 of the wiring member 3.

In the printed wiring board 1C, the input current from the external electric-power source is applied to the current path part 2a through the protruding part 2a1. The current applied to the current path part 2a is input to the electronic parts 20a and 20b through the metal connection part 8, the metal layer 6, and the terminals 21.

In the printed wiring board 1C according to the second embodiment, a via 10 is arranged, which electrically connects the metal layer 6 and the conductive plate 9 with each other while penetrating the high heat-radiation resin layer 5, the metal plate 2 (see FIG. 6), and the wiring member 3. The current output from the electronic parts 20a and 20b is output to outside through the terminals 21, the metal layer 6 and the via 10, and the conductive plate 9 and the conductive protruding part 9a.

Similarly to the printed wiring board 1, the metal layer 6 and the metal connection parts 8 as well as the high heat-radiation resin layer 5 are arranged at the positions on the front surface of the heat radiation part 2c where the electronic parts 20a and 20b are mounted. Moreover, the metal layer 6 and bottom surfaces of the electronic parts 20a and 20b are connected with each other by the conductive bonding members 22. Therefore, similarly to the printed wiring board 1 according to the first embodiment, the heat generated from the electronic parts 20a and 20b can be effectively conducted to the heat radiation part 2c.

Surfaces between the current path part 2a and the heat radiation part 2c and surfaces of the conductive plate 9 other than the conductive protruding part 9a are covered with the resin 7 so as to ensure the insulation property.

Figure 9:
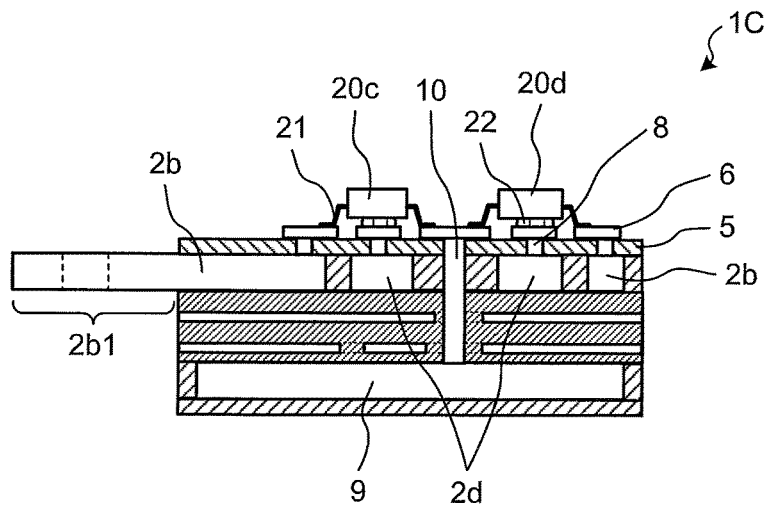
FIG. 9 is a cross-sectional view taken along a line X3-X3 illustrated in FIG. 6.

FIG. 9 is a cross-sectional view taken along a line X3-X3 illustrated in FIG. 6. The current applied to the conductive plate 9 from the external device is input to the electronic parts 20c and 20d through the via 10, the metal layer 6, and the terminals 21. The current output from the electronic parts 20c and 20d is output to the grounded part through the terminals 21, the metal layer 6 and the metal connection part 8, and the current path part 2b and the protruding part 2b1.

The metal layer 6 and the metal connection parts 8 as well as the high heat-radiation resin layer 5 are arranged at the positions on the front surface of the heat radiation part 2d where the electronic parts 20c and 20d are mounted. Moreover, the metal layer 6 and bottom surfaces of the electronic parts 20c and 20d are connected with each other by the conductive bonding members 22.

Figure 10:
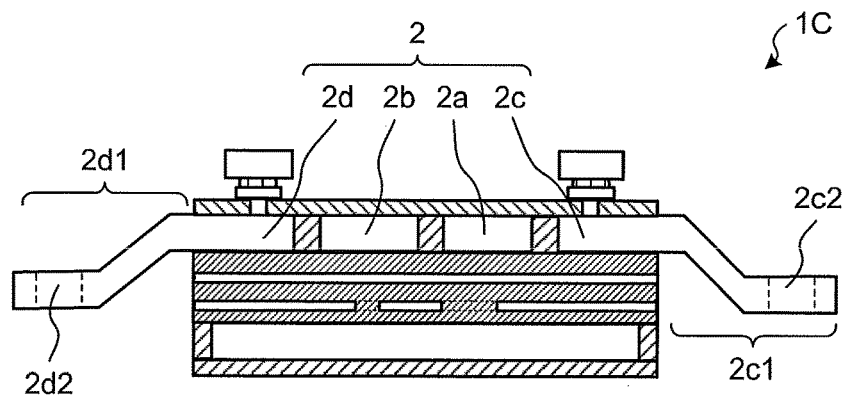
FIG. 10 is a cross-sectional view taken along a line X4-X4 illustrated in FIG. 6.

FIG. 10 is a cross-sectional view taken along a line X4-X4 illustrated in FIG. 6. As illustrated in FIG. 10, in the printed wiring board 1C, the protruding parts of the metal plate 2 can be shaped by bending in one or both of the front-surface and back-surface directions of the metal plate 2. In FIG. 10, the example is illustrated, in which the protruding part 2c1 of the heat radiation part 2c and the protruding part 2d1 of the heat radiation part 2d are bended in the back-surface direction of the metal plate 2.

The protruding parts of the metal plate 2 can be bent, and thus the shapes (in FIG. 10, through-holes 2c2 and 2d2) that are directly connectable with the external terminals 31 can be employed so as to be able to accord to various positions of the external terminals 31 (see FIG. 2). Therefore, the arrangement freedom of the external terminals 31 in the housing 30 can be improved.

In the printed wiring board 1C, the protruding parts 2c1 and 2d1 of the respective heat radiation parts 2c and 2d are bent, the protruding parts 2a1 and 2b1 (see FIG. 6) of the respective current path parts 2a and 2b may be bent. In the printed wiring board 1C, both of the protruding part 2c1 and 2d1 are bent in the back-surface direction of the metal plate 2. However, for example, one of the protruding part may be bent in the back-surface direction of the metal plate 2, and the other protruding part may be bent in the front-surface direction of the metal plate 2. Moreover, both of the protruding parts may be bent in the front-surface direction of the metal plate 2.

Third Modification

Figure 11:
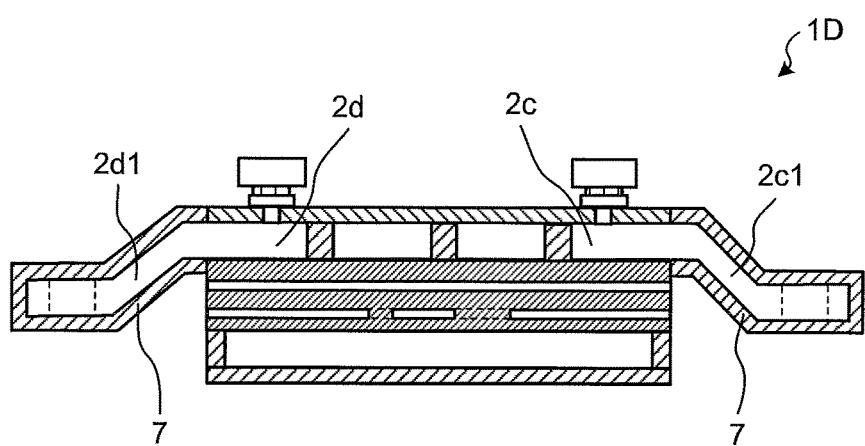
FIG. 11 is a cross-sectional view illustrating a printed wiring board according to a third modification of the second embodiment.

FIG. 11 is a cross-sectional view illustrating a printed wiring board 1D according to a third modification of the second embodiment. FIG. 11 corresponds to FIG. 10 according to the second embodiment.

Difference between the printed wiring board 1D according to the third modification of the second embodiment and the printed wiring board 1C according to the second embodiment is a configuration of the resin V.

In the printed wiring board 1D, the resin 7 covers all of the surfaces of the protruding parts 2c1 and 2d1 of the respective heat radiation parts 2c and 2d. Therefore, when the printed wiring board 1D is arranged on the housing 30 (see FIG. 2), the heat radiation parts 2c and 2d can be directly fixed to the housing 30 while ensuring the insulation property therebetween, and thus the easiness of attachment thereof to the housing 30 can be improved.

As described above, the embodiments according to the present disclosure are explained, the present disclosure is not limited to the aforementioned embodiments, and thus design changes within a range of the main ideas of the present disclosure may be properly performed. For example, in the printed wiring board 1 according to the first embodiment, the protruding part of the metal plate 2 may be bent in the front-surface or back-surface direction of the metal plate 2.

The example has been illustrated, in which the printed wiring board 1 is connected with the integrally formed housing 30. However, a plurality of housings may be connected with the corresponding protruding parts. Moreover, the example has been illustrated, in which the through-holes 2a2 to 2c2 are connected with the respective external terminals 31 by using the nuts 32, however, the connection with the housing 30 is not limited thereto. The leading end of the protruding part may be formed into a press-fit shape to be inserted into a corresponding hole of the external terminal so as to connect them with each other.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A printed wiring board comprising:
 a metal plate that includes:
  a current path part that is a main current path of an electronic part mounted on or above a front surface of the metal plate; and
  a heat radiation part that radiates heat generated from the electronic part; and
 a printed board that is arranged completely under a back surface of the metal plate, the printed board being configured by laminating a resin layer and a wired layer, wherein
 the current path part and the heat radiation part are in a same layer to be integrally formed with the printed board, and
 the metal plate is arranged between the electronic part and the printed board.

2. The printed wiring board according to claim 1, wherein the current path part is separately arranged from the heat radiation part in planar view.

3. The printed wiring board according to claim 1, wherein the heat radiation part is arranged to include, in planar view, a position where the electronic part is mounted.

4. The printed wiring board according to claim 1, wherein
 the metal plate includes a protruding part that protrudes, in planar view, from the printed board, and
 the protruding part is shaped to be directly connectable with an external device.

5. The printed wiring board according to claim 4, wherein the protruding part is bent in one or both of front-surface and back-surface directions of the metal plate.

6. The printed wiring board according to claim 4, wherein
 the printed board has a rectangular shape in planar view, and
 the protruding part includes a protruding part of the current path part and a protruding part of the heat radiation part that protrude, in planar view, from different sides of the printed board, respectively.

7. The printed wiring board according to claim 1, further comprising a heat-radiation resin layer that is arranged at the position on the front surface of the metal plate where the electronic part is mounted.

8. The printed wiring board according to claim 7, further comprising a metal layer that is arranged on the heat-radiation resin layer, wherein
 a metal connection part is provided in the heat-radiation resin layer to connect the metal plate and the metal layer by using metal.

9. The printed wiring board according to claim 1, further comprising a conductive plate that is a main current path of the electronic part and is arranged on or above a surface of the printed board, the surface of the printed board being opposed to a surface facing the metal plate.

10. The printed wiring board according to claim 9, wherein
- the conductive plate includes a conductive protruding part that protrudes, in planar view, from the printed board, and
- the conductive protruding part is shaped to be directly connectable with an external device.

11. A printed wiring board comprising:
- a metal plate that includes:
  - a current path part that is a main current path of an electronic part mounted on or above a front surface of the metal plate; and
  - a heat radiation part that radiates heat generated from the electronic part; and
- a printed board that is arranged under a back surface of the metal plate, the printed board being configured by laminating a resin layer and a wired layer, wherein
- the current path part and the heat radiation part are in a same layer to be integrally formed with the printed board, and
- the metal plate is arranged between the electronic part and the printed board such that the electronic part and the printed board are positioned on opposite sides of the metal plate.

* * * * *